United States Patent
Kaneko

(10) Patent No.: US 7,450,625 B2
(45) Date of Patent: Nov. 11, 2008

(54) OPTICAL ELEMENT AND METHOD FOR MANUFACTURING THE SAME

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 22 days.

(21) Appl. No.: 11/419,084

(22) Filed: May 18, 2006

(65) Prior Publication Data

US 2006/0274800 A1 Dec. 7, 2006

(30) Foreign Application Priority Data

Jun. 2, 2005 (JP) ............................. 2005-162539

(51) Int. Cl.
*H01S 3/097* (2006.01)

(52) U.S. Cl. ................... 372/87; 372/43.01; 372/44.01; 372/38.05

(58) Field of Classification Search .................. 372/87, 372/43.01, 44.01, 38.05
See application file for complete search history.

(56) References Cited

U.S. PATENT DOCUMENTS

| | | | | |
|---|---|---|---|---|
| 5,434,426 A | * | 7/1995 | Furuyama et al. | ........... 250/551 |
| 6,364,541 B1 | * | 4/2002 | Nesnidal et al. | ............... 385/92 |
| 6,700,914 B2 | * | 3/2004 | Yokouchi et al. | ......... 372/50.11 |
| 2001/0010388 A1 | * | 8/2001 | Yanagihara et al. | ......... 257/565 |
| 2003/0063649 A1 | | 4/2003 | Ezaki et al. | |
| 2004/0232429 A1 | * | 11/2004 | Miki et al. | ..................... 257/79 |
| 2005/0056772 A1 | | 3/2005 | Kaneko | |
| 2005/0121678 A1 | * | 6/2005 | Ezaki et al. | ................... 257/79 |

FOREIGN PATENT DOCUMENTS

| | | |
|---|---|---|
| JP | A-07-176787 | 7/1995 |
| JP | A-10-242560 | 9/1998 |
| JP | A-2003-110196 | 4/2003 |
| JP | A-2005-045049 | 2/2005 |

* cited by examiner

*Primary Examiner*—Minsun Harvey
*Assistant Examiner*—Kinam Park
(74) *Attorney, Agent, or Firm*—Oliff & Berridge, PLC

(57) ABSTRACT

An optical element includes a columnar section having an upper surface from which light is emitted or upon which light is incident, and an electrode composed of a plurality of layers including at least a first conductive layer and a second conductive layer laminated above the first conductive layer and electrically connected to the upper surface of the columnar section, wherein the first conductive layer has a first opening section that opens outwardly from a center section of the upper surface of the columnar section and surrounds the center section, and the second conductive layer has a second opening section that opens outwardly from the center section of the upper surface of the columnar section, surrounds the center section, and overlaps the first conductive layer above the columnar section by more than a half of a plane area of the first conductive layer.

12 Claims, 3 Drawing Sheets

OPTICAL ELEMENT AND METHOD FOR MANUFACTURING THE SAME

The entire disclosure of Japanese Patent Application No. 2005-162539, filed Jun. 2, 2005 is expressly incorporated by reference herein.

BACKGROUND

1. Technical Field

The present invention relates to optical elements and methods for manufacturing the same.

2. Related Art

Optical elements such as surface-emitting type semiconductor lasers, which include a columnar section and an electrode formed thereon, may often have a structure in which the electrode is formed in a closed ring shape in a center area of the upper surface of the columnar section. Such a structure may be described in Japanese Laid-open Patent Application JP-A-10-242560. As a method for patterning an electrode in an optical element, for example, a lift-off method is known. According to this method, a resist is formed in a reverse configuration on a substrate surface, a conductive material film is formed on the resist and its open areas, and the resist is then peeled off by a solvent whereby portions of the conductive material deposited on the resist are removed. In this case, if an electrode is to be formed in a ring shape, the resist forms an isolated pattern in the center area of the ring shape. The isolated pattern is difficult to he removed, and even if removed, the conductive material that has been lifted off may be re-adhered, which might possibly damage the reliability of the optical element.

SUMMARY

In accordance with an advantage of some aspects of the present invention, optical elements and methods for manufacturing the same which can improve the reliability and facilitate the manufacturing process can be provided.

(1) An optical element in accordance with an embodiment of the invention includes: a columnar section having an upper surface from which light is emitted or upon which light is incident; and an electrode composed of a plurality of layers including at least a first conductive layer and a second conductive layer laminated above the first conductive layer and electrically connected to the upper surface of the columnar section, wherein the first conductive layer has a first opening section that opens outwardly from a center section of the upper surface of the columnar section and surrounds the center section, and the second conductive layer has a second opening section that opens outwardly from the center section of the upper surface of the columnar section, surrounds the center section, and overlaps the first conductive layer above the columnar section by more than a half of a plane area of the first conductive layer.

According to the present embodiment, each of the conductive layers is formed with an opening section, such that, for example, a so-called isolated pattern of resist which may be generated in a lift-off method does not need to be formed, and peeling of the resist becomes easier. Also, not only in a lift-off method, but also, for example, in the case of etching, a closed minute opening area does not need to be formed by resist such that exposure and etching of the resist can be facilitated. Furthermore, the second conductive layer overlaps the first conductive layer by more than a half of the plane area of the first conductive layer, such that a thick electrode can be readily formed, and therefore the heat dissipation of the upper surface of the columnar section can be improved. Accordingly, a highly reliable optical element can be provided.

It is noted that, in the present invention, the case of a layer B being provided above a specific layer A includes a case where the layer B is directly provided on the layer A, and a case where the layer B is provided over the layer A through another layer. This similarly applies to the following embodiments of the invention.

(2) In the optical element, at least one of the first and second conductive layers may have a wiring section that extends in an outward direction of the columnar section, and the first and second opening sections may open outwardly in directions different from a direction in which the wiring section extends.

By this, the electrode can be thickly formed near the wiring section, such that its heat dissipation can be improved and wire disconnection can be prevented.

(3) In the optical element, the first and second opening sections may open outwardly in different directions, respectively, and the electrode may be in a ring shape that encloses the center section of the upper surface of the columnar section.

By this, an electrode having a ring shape can be readily obtained, whereby an electric current that circulates through the columnar section can be made uniform.

(4) In the optical element, the electrode may further include a third conductive layer laminated above the second conductive layer, wherein the third conductive layer may have a third opening section that opens outwardly from the center section of the upper surface of the columnar section and surrounds the columnar section.

(5) A method for manufacturing an optical element in accordance with an embodiment of the invention includes the steps of: forming, above a substrate, a columnar section having an upper surface from which light is emitted or upon which light is incident; and forming an electrode electrically connected to the upper surface of the columnar section with a plurality of layers including at least a first conductive layer and a second conductive layer laminated above the first conductive layer, wherein the first conductive layer is formed with a first opening section that opens outwardly from a center section of the upper surface of the columnar section and surround the center section, and the second conductive layer is formed with a second opening section that opens outwardly from the center section of the upper surface of the columnar section, to surround the center section, and to overlap the first conductive layer above the columnar section by more than a half of the plane area of the first conductive layer.

According to the present embodiment, each of the conductive layers is formed with an opening section, such that, for example, a so-called isolated pattern of resist which may be generated in a lift-off method does not need to be formed, and peeling of the resist becomes easier. Also, not only in a lift-off method, but also, for example, in the case of etching, a closed minute opening area does not need to be formed by resist, such that exposure and etching of the resist can be facilitated. Accordingly, the manufacturing process can be facilitated and the yield can be improved.

(6) In the method for manufacturing an optical element, the electrode may be formed in a manner to include a third conductive layer laminated above the second conductive layer, and the third conductive layer may be formed with a third opening section that opens outwardly from the center section of the upper surface of the columnar section and to surround the center section.

(7) In the method for manufacturing an optical element, the first, second and third conductive layers may be formed by using a lift-off method or an etching method.

DESCRIPTION OF EXEMPLARY EMBODIMENTS

A preferred embodiment of the invention is described below with reference to the accompanying drawings.

A. Optical Element

Figure 1:
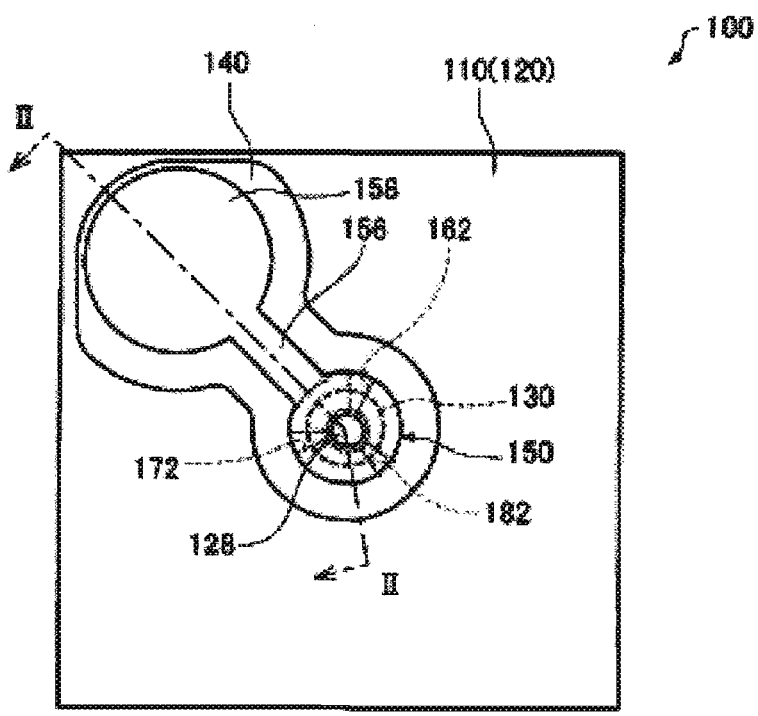
FIG. 1 is a plan view of an optical element in accordance with an embodiment of the invention.
Figure 2:
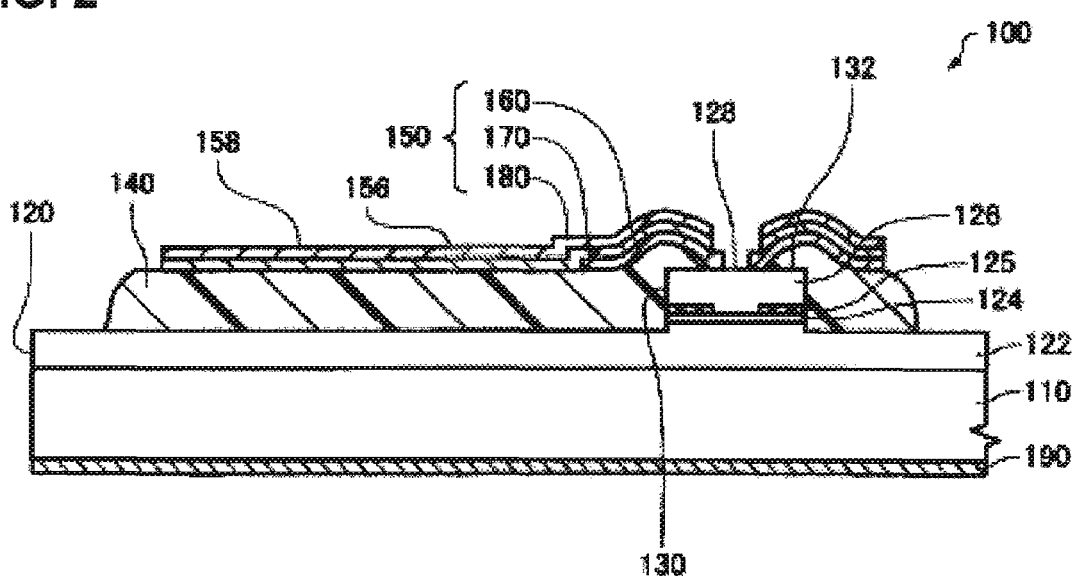
FIG. 2 is a cross-sectional view of the optical element in accordance with the embodiment of the invention.

FIG. 1 is a plan view of an optical element in accordance with an embodiment of the present invention. FIG. 2 is a cross-sectional view taken along a line II-II of FIG. 1.

The optical element 100 includes a substrate 110, an element section 120 (a columnar section 130), a resin layer 140, an electrode 150 and another electrode 190. In the present embodiment, a case in which the optical element 100 is a surface-emitting type device (e.g., a surface-emitting type semiconductor laser) is described as an example.

(A-1) First, the substrate 110 and the element section 120 are described.

The substrate 110 is a semiconductor substrate (for example, an n-type GaAs substrate). The element section 120 is formed on the substrate 110. The plane configuration of the substrate 110 and the element section 120 may be identical to each other (for example, rectangular shape). When the optical element 100 is a surface-emitting type semiconductor laser, the element section 120 is called a resonator (i.e., a vertical resonator).

The element section 120 includes the columnar section 130. As shown in FIG. 2, the element section 120 may have a convex cross-sectional shape, and a protruded section of the convex cross-sectional shape may define the columnar section 130. The columnar section 130 may have a side surface that is vertical or positively tapered with respect to the substrate surface. The columnar section 130 may have a plane configuration that is in a circular shape, a rectangular (square or oblong) shape or any one of other polygonal shapes. In the example shown in FIG. 1, a single columnar section 130 is formed on a single substrate 110, but a plurality of columnar sections 130 may be formed thereon. A central portion of the upper surface 132 of the columnar section 130 defines an optical surface for emission or incidence of light (laser beam) (which is referred to as an emission surface in the case of a surface-emitting type semiconductor laser) 128. The optical surface 128 is exposed through an opening in the resin layer 140 and the electrode 150.

Alternatively, the columnar section 130 may have a structure that is not completely columnar on its appearance, and may form a part of the element section 120 that is, for example, a rectangular parallelepiped shape. In this case, when the optical element is a surface-emitting type semiconductor laser, the plane area (in other words, the upper surface 132) of the columnar section 130 may be defined by an area overlapping a current constricting layer (a dielectric layer) for controlling the path of electric current and an area surrounded by the current constricting layer.

The element section 120 is formed from, for example, a first mirror (a first semiconductor layer in a wider sense) 122 that is a distributed reflection type multilayer mirror of 40 pairs of alternately laminated n-type $Al_{0.9}Ga_{0.1}As$ layers and n-type $Al_{0.15}Ga_{0.85}As$ layers, an active layer 124 (a functional layer in a wider sense) that is composed of GaAs well layers and $Al_{0.3}Ga_{0.7}As$ barrier layers in which the well layers include a quantum well structure composed of three layers, and a second mirror (a second semiconductor layer in a wider sense) 126 that is a distributed reflection type multilayer mirror of 25 pairs of alternately laminated p-type $Al_{0.9}Ga_{0.1}As$ layers and p-type $Al_{0.15}Ga_{0.85}As$ layers, which are successively laminated. It is noted that the composition of each layer and the number of layers composing the first mirror 122, the active layer 124 and the second mirror 126 may not be limited to the above. Also, the active layer 124 includes a layer in which recombinations of carriers occur, and may have a single quantum well structure or a multiple quantum well structure.

The second mirror 126 is made to be p-type by doping, for example, C, Zn or Mg, and the first mirror 122 is made to be n-type by doping, for example, Si or Se. Accordingly, a pin diode is formed with the second mirror 126, the active layer 124 in which no impurity is doped, and the first mirror 122.

A current constricting layer 125 composed of aluminum oxide as the main component is formed in a region near the active layer 124 among the layers composing the second mirror 126. The current constricting layer 125 may be formed in a ring shape. In other words, the current constricting layer 125 has a cross section defined by concentric circles when cut in a plane parallel with the optical surface 128.

The columnar section 130 refers to a semiconductor laminated body including at least the second mirror 126 (for example, the second mirror 126, the active layer 124 and a portion of the first mirror 122 in the example shown in FIG. 2). The columnar section 130 is supported on the substrate 110.

(A-2) Next, the resin layer 140 is described.

The resin layer 140 is formed over the substrate 110 (the element section 120). As shown in FIG. 1, the resin layer 140 is formed in a region including at least the circumference of the columnar section 130. Also, the resin layer 140 is formed as a base layer of the electrode 150 (a pad section 158 in particular). By this, planarization of the surface becomes possible, and patterning of the electrode would become easier. Also, by placing the resin with a low dielectric constant between the element section 120 and the electrode 150, the parasitic capacitance can be reduced. It is noted that the resin layer 140 may be formed to a thickness that is generally the same as that of the columnar section 130.

When the resin layer 140 does not have an optical transparency, the resin layer 140 is formed in a region that avoids at least the optical surface 128. In the example shown in FIG. 2, the resin layer 140 is formed to cover the side surface of the columnar section 130, cover a boundary (a corner section) between the upper surface 132 and the side surface of the columnar section 130, and extend to an end section of the upper surface 132 of the columnar section 130.

Alternatively, as a modified example, the resin layer 140 may be formed in an area that avoids the entire area of the upper surface 132 of the columnar section 130. In this case, the upper surface of the resin layer 140 and the upper surface 132 of the columnar section 130 may be made generally flush with each other such that a step difference is not generated at the boundary between the columnar section 130 and the resin layer 140.

Also, the resin layer 140 may be formed continuously along the rim (i.e., along the entire periphery) of the upper surface 132 of the columnar section 130. Also, the resin layer 140 may be smoothly sloped such that it gradually thins from the rim of the columnar section 130 toward its center, whereby disconnection of the electrode 150 can be effectively prevented.

The resin layer 140 may be formed with, for example, polyimide resin, fluororesin, acrylic resin, or epoxy resin.

(A-3) Next, the entire structure including the electrode 150 and the other electrode 160 is described.

The electrode 150 is electrically connected to the upper surface 132 of the columnar section 130. For example, the electrode 150 is electrically connected to the second mirror 126 at an end section of the upper surface 132 of the columnar section 130 (in other words, in a region that avoids the optical surface 128). Also, in the example shown in FIG. 1, the electrode 150 is formed continuously along the rim (i.e., along the entire periphery) of the upper surface 132 of the columnar section 130, and its connecting area with the second mirror 126 forms a closed ring shape. In other words, the electrode 150 is formed in a manner to surround the center section of the upper surface 132 of the columnar section 130. Further, a portion that is exposed through the opening of the electrode 160 defines the optical surface 128. The electrode 150 may be formed from at least one layer composed of a conductive material, such as, for example, Au, Pt, Ti, Zn, Cr, Ni or an alloy of at least two of the aforementioned materials.

The electrode 150 is formed in a manner to extend from the upper surface 132 of the columnar section 130 over the resin layer 140, and has a pad section 158 on the resin layer 140. The pad section 158 is an external electrical connection section, and may include a bonding region for bonding a conductive material (not shown) such as a wire and a bump. When a portion of the electrode 150 that connects the pad section 158 and the columnar section 130 serves as a wiring section 156, the width of the pad section 158 may be made wider than the wiring section 156.

The other electrode 190 is electrically connected to a portion on the side of the first mirror 122. The other electrode 190 may be formed on the back surface of the substrate 110, or a portion of the substrate 110 (the element section 120) may be exposed through the resin layer 140, and the other electrode 190 may be connected to the exposed portion. The electrode 190 may be formed from at least one layer composed of a conductive material, such as, for example, Au, Ge, Ni, In, W, Cr or an allow of at least two of the aforementioned materials.

An electric current can be injected in the active layer 124 between the first and second mirrors 122 and 126 by the electrodes 150 and 190. It is noted that the material of the electrodes 150 and 190 is not limited to those described above.

(A-4) The electrode 150 is formed from a plurality of layers including at least two layers of conductive materials. In the following description, a case in which the electrode 150 includes first, second and third conductive layers 160, 170 and 180 is described as an example, but the number of layers is not limited to this example. It is noted that FIG. 3-FIG. 5 are plan views of the conductive layers, respectively.

Figure 3:
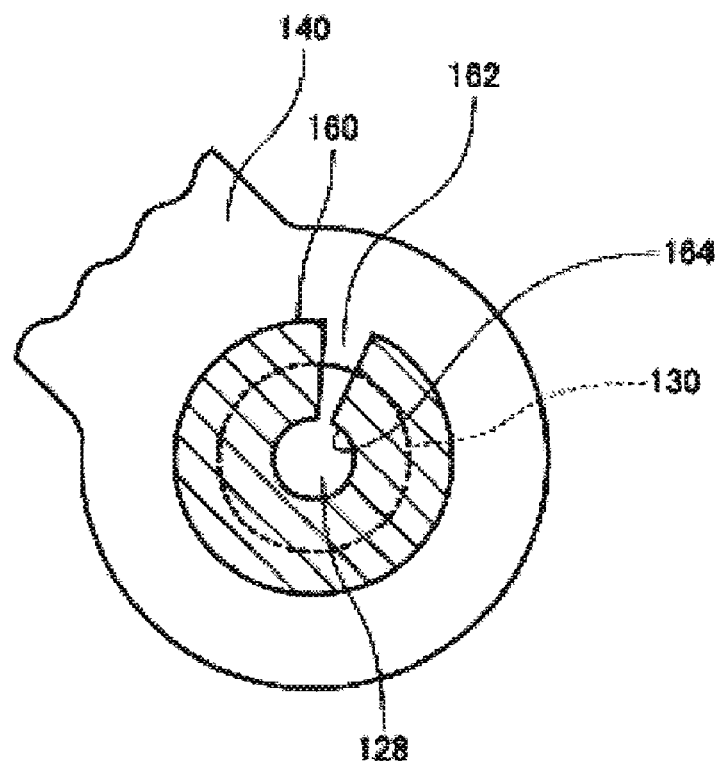
FIG. 3 is an enlarged view in part of the optical element in accordance with the embodiment of the invention.

As shown in FIG. 3, the first conductive layer 160 is formed on the upper surface 132 of the columnar section 130 and its circumference (only). The first conductive layer 160 is formed in a manner to make an ohmic contact with the upper surface 132 of the columnar section 130. For example, when the second mirror 126 is p-type, the first conductive layer 160 may be formed from a laminated structure of Cr, Ti, Pt and Au.

The first conductive layer 160 is formed in a manner to surround the center section of the upper surface 132 of the columnar section 130 avoiding a first opening section 162 that opens outwardly from the center section. In other words, the first conductive layer 160 does not completely surround the center section of the upper surface 132 of the columnar section 130, but is in a state in which it is opened at the first opening section 162. In other words, the conductive layer 160 is provided with a first aperture 164 on the center section of the upper surface 132 of the columnar section 130, and the first opening section 162 connects to the first aperture 164 and extends outwardly. The upper surface 132 of the columnar section 130 and the resin layer 140 are exposed through the first opening section 162. Also, the portion exposed through the first aperture 164 defines the optical surface 128, whose plane configuration generally defines, for example, a circular shape. Also, the width of the first opening section 162 (i.e., the width in a direction orthogonal to the direction outwardly extending from the center section of the upper surface 132 of the columnar section 130) may be smaller than the width of the first aperture 164 (e.g., the diameter thereof if the first aperture 164 is circular), or may be generally the same. When viewed in a plan view, it can also be said that the first conductive layer 160 is in a C shape having a predetermined width.

Figure 4:
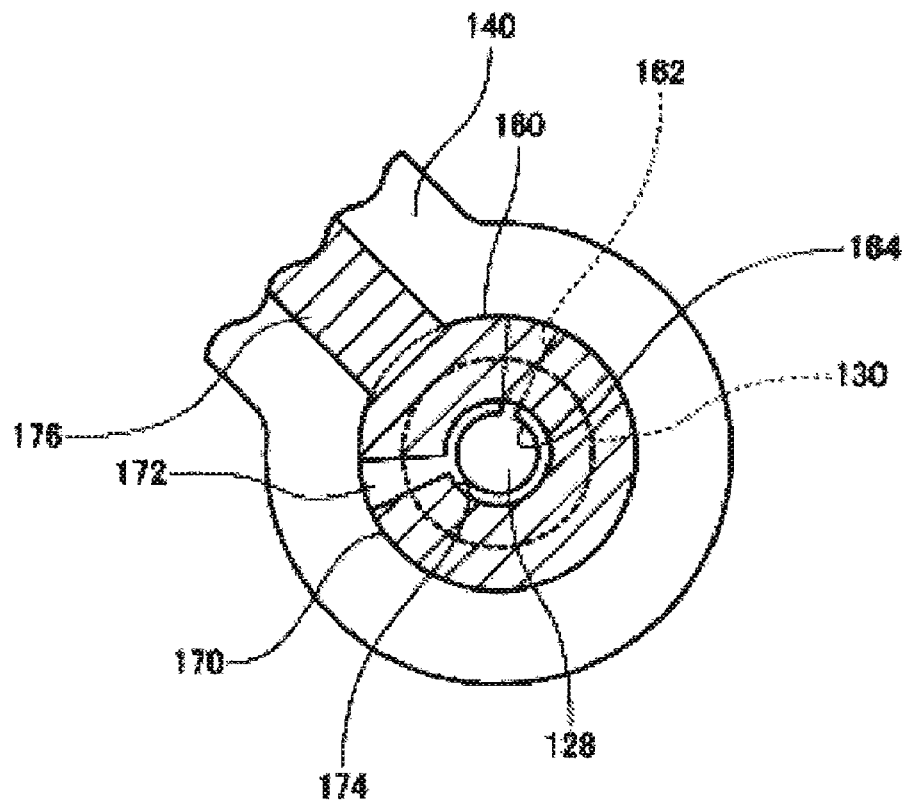
FIG. 4 is an enlarged view in part of the optical element in accordance with the embodiment of the invention.
Figure 5:
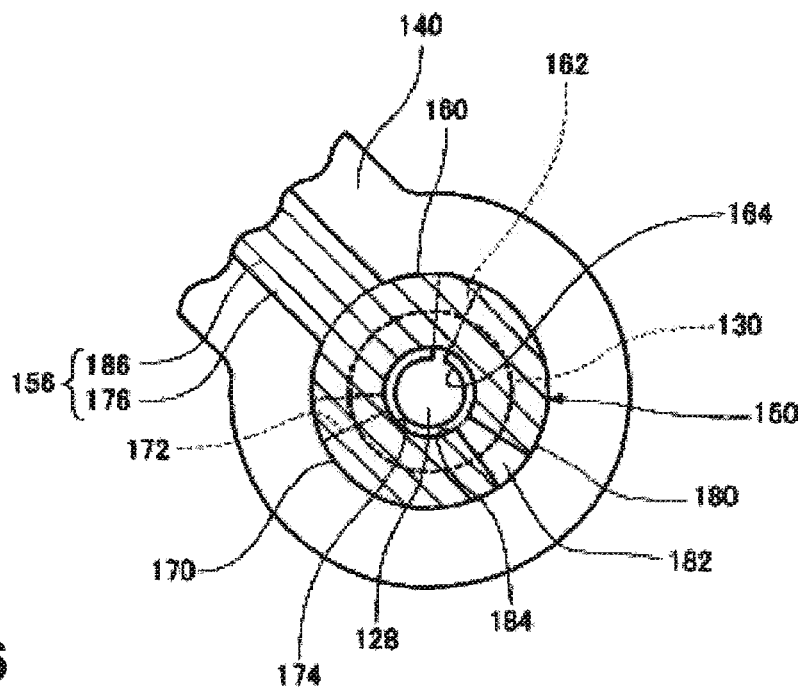
FIG. 5 is an enlarged view in part of the optical element in accordance with the embodiment of the invention.

As shown in FIG. 4, the second conductive layer 170 is laminated on the first conductive layer 160. The second conductive layer 170 may be formed thicker than the first conductive layer 160. The second conductive layer 170 is formed in a manner that it can make an electrical connection with the first conductive layer 160, and is formed from a layer containing, for example, Au, without any particular limitation to this material.

The second conductive layer 170 is formed in a manner to surround the center section of the upper surface 132 of the columnar section 130 avoiding a second opening section 172 that opens outwardly from the center section. In other words, the second conductive layer 170 does not completely surround the center section of the upper surface 132 of the columnar section 130, but is in a state in which it is opened at the second opening section 172. In other words, the conductive layer 170 is provided with a second aperture 174 over the center section of the upper surface 132 of the columnar section 130, and the second opening section 172 connects to the second aperture 174 and extends outwardly.

The first conductive layer 160 (only) is exposed through the second opening section 172. In other words, the first and second opening sections 162 and 172 open outwardly in mutually different directions, respectively. By this, the first and second opening sections 162 and 172 are not connected to each other, and the electrode 150 is formed in a manner to surround the center section of the upper surface 132 of the columnar section 130 in a ring shape, as described above, such that the injection current to the columnar section 130 can be made uniform.

In the example shown in FIG. 4, the outer periphery of the second conductive layer 170 concurs with the outer periphery of the first conductive layer 160 (except a wiring section 176 to be described below), and the inner periphery of the second conductive layer 170 is wider than the inner periphery of the first conductive layer 160. In other words, the first aperture 164 is provided inside the second aperture 174. By so doing, the film thickness of the electrode 150 can be made thinner in an area immediately adjacent to the optical surface 128, and thicker in the remaining area further outside. For this reason, for example, when the optical element is a surface-emitting type semiconductor laser, the film thickness of the electrode 150 immediately adjacent to the optical surface 128, which affects the emission angle of a laser beam, would be more readily controlled, and the degree of freedom in design can be improved.

It is noted that the second aperture 174 may be in a configuration that is similar to that of the first aperture 164 (for example, a generally circular shape). Also, like the first conductive layer 160, the width of the second opening section 172 may be smaller than the width of the second aperture 174, or may be generally the same. Also, as viewed in a plan view, it can also be said that the second conductive layer 170 includes a portion in a C shape having a predetermined width.

The second conductive layer 170 is formed in a manner to overlap the first conductive layer 160 over the columnar section 130 (more specifically, in a range that is surrounded by a broken line indicated in FIG. 4) by more than a half of the plane area of the first conductive layer 160. By this, the electrode 150 can be formed thick above the columnar section 130, such that the heat dissipation of the upper surface 132 of the columnar section 130 can be improved.

The second conductive layer 170 includes a wiring section 176. The wiring section 176 composes at least a portion of the wiring section 156 that connects to the pad section 158, and extends outwardly from the columnar section 130. The second conductive layer 170 may have not only a portion that composes the wiring section 176, but also a portion that composes a part of the pad section 158. Also, when the second conductive layer 170 has the wiring section 176, the first and second opening sections 162 and 172 are provided in a manner to open outwardly in directions different from the direction in which the wiring section 176 extends. By so doing, the electrode 150 can be formed thick in an area adjacent to the wiring section 156, such that its heat dissipation can be improved and disconnection of the wiring can be prevented.

As shown in FIG. 5, if necessary, a third conductive layer 180 may further be laminated on the second conductive layer 170. The third conductive layer 180 may be formed thicker than the first conductive layer 160. The third conductive layer 180 is formed in a manner that it can make an electrical connection with the first and second conductive layers 160 and 170, and is formed from a layer containing, for example, Au, without any particular limitation to this material.

The third conductive layer 180 is formed in a manner to surround the center section of the upper surface 132 of the columnar section 130 avoiding a third opening section 182 that opens outwardly from the center section. In other words, the third conductive layer 180 does not completely surround the center section of the upper surface 132 of the columnar section 130, but is in a state in which it is opened at the third opening section 182. In other words, the conductive layer 180 is provided with a third aperture 184 over the center section of the upper surface 132 of the columnar section 130, and the third opening section 182 connects to the third aperture 184 and extends outwardly.

The second conductive layer 170 (only) is exposed through the third opening section 182. In other words, the second and third opening sections 172 and 182 open outwardly in mutually different directions, respectively. By this, the second and third opening sections 172 and 182 are not connected to each other, and the electrode 150 is formed in a manner to surround the center section of the upper surface 132 of the columnar section 130 in a ring shape, as described above, such that the injection current to the columnar section 130 can be made uniform.

In the example shown in FIG. 5, the outer periphery of the third conductive layer 180 concurs with the outer periphery of the second conductive layer 170 (including a wiring section 186 to be described below), and the inner periphery of the third conductive layer 180 concurs with the inner periphery of the second conductive layer 170. In other words, the external shapes of the second and third apertures 174 and 184 concur with each other. It is noted that the third aperture 184 may have a configuration that is similar to that of the first aperture 164 (for example, a generally circular shape). Also, like the first conductive layer 160, the width of the third opening section 182 may be smaller than the width of the third aperture 184, or may be generally the same. Also, as viewed in a plan view, it can also be said that the third conductive layer 180 includes a portion in a C shape having a predetermined width.

The third conductive layer 180 is formed in a manner to overlap the second conductive layer 170 over the columnar section 130 (more specifically, in a range that is surrounded by a broken line indicated in FIG. 5) by more than a half of the plane area of the second conductive layer 170. By this, the electrode 150 can be formed thick above the columnar section 130, such that the heat dissipation of the upper surface 132 of the columnar section 130 can be improved.

The third conductive layer 180 includes a wiring section 186. The wiring section 186 composes at least a portion of the wiring section 156 that connects to the pad section 158, and extends outwardly from the columnar section 130. The third conductive layer 180 may have not only a portion that composes the wiring section 186, but also a portion that composes a part of the pad section 158. Also, when the third conductive layer 180 has the wiring section 186, the first, second and third opening sections 162, 172 and 182 are provided in a manner to open outwardly in directions different from the direction in which the wiring section 186 extends. By so doing, the electrode 150 can be formed thick in an area adjacent to the wiring section 156, such that its heat dissipation can be improved and disconnection of the wiring can be prevented.

In the example shown in FIG. 5, when the extending direction of the wiring section 176 is assumed to be a direction at 12 o'clock as viewed from the center of the upper surface 132 of the columnar section 130, the first, second and third opening sections 162, 172 and 182 open in directions at 2 o'clock, 10 o'clock and 6 o'clock, respectively. By this, the first, second and third opening sections 162, 172 and 182 are disposed equally from one other, such that differences in the film thickness of the electrode 150 can be suppressed. It is noted that the direction and size of each of the opening sections of the conductive layers are not particularly limited, and their designs can be optionally decided.

By the optical element in accordance with the present embodiment, opening sections (i.e., the first, second and third opening sections 162, 172 and 182) are formed in the conductive layers (i.e., the first, second and third conductive layers 160, 170 and 180), respectively, such that there is no need to form a so-called isolated pattern of resist in a lift-off method, and peeling of the resist becomes easier. More specifically, the resist can be removed well, and portions of the resist or the conductive material that have been removed would not re-adhere to other areas. Also, not only in a lift-off method, but also in the case of etching, there is no need to form a minute closed opening region with resist, such that exposure and etching of the resist becomes easier. Also, because the second conductive layer 170 overlaps the third conductive layer 160 by more than a half of the plane area of the first conductive layer 160, it is easy to form the electrode 150 thick, and therefore the heat dissipation of the upper surface 132 of the columnar section 130 can be improved. Accordingly, a highly reliably optical element can be provided.

(A-5) It is noted that the optical element in accordance with the present embodiment is not limited to surface-emitting type semiconductor lasers, but is also applicable to other types of light emitting elements (such as, for example, a semiconductor light emitting diode, and an organic LED), or to light receiving elements (such as, for example, photodiodes). In the case of a light receiving element, the optical surface 128 of the columnar section 130 defines a light incidence surface. In the case of a light receiving element, the element has at least a photoabsorption layer (a functional layer in a wider sense). Also, in this case, semiconductor layers (also referred to as contact layers) may often be provided above and below the photoabsorption layer.

Further, the p-type or n-type property in each of the semiconductor layers described above can be interchanged. Although the example above is described with reference to AlGaAs type material, other materials, such as, for example, GaInP type, ZnSSe type, InGaN type, AlGaN type, InGaAs type, GaInNAs type, and GaAsSb type semiconductor materials may be used according to specified oscillation frequencies.

Also, the substrate 110 may be omitted in the embodiment described above. More specifically, after the element section 120 has been formed on the substrate 110, an optical element may be manufactured by a method in which the element section 120 is finally peeled off from the substrate 110 (by an epitaxial lift-off method).

Also, the details of the first, second and third conductive layers 160, 170 and 180 described above may be interchanged and applied among these layers. For example, the first conductive layer 160 may have a portion that composes a part of the wiring section 156 (and the pad section 158).

B. Method for Manufacturing Optical Element

Figure 6:
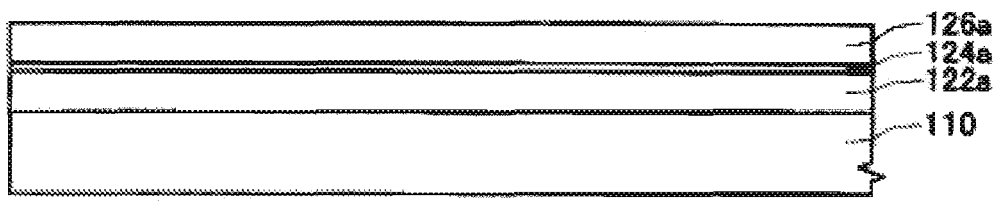
FIG. 6 is a view showing a step of a method for manufacturing an optical element in accordance with an embodiment of the invention.
Figure 7:
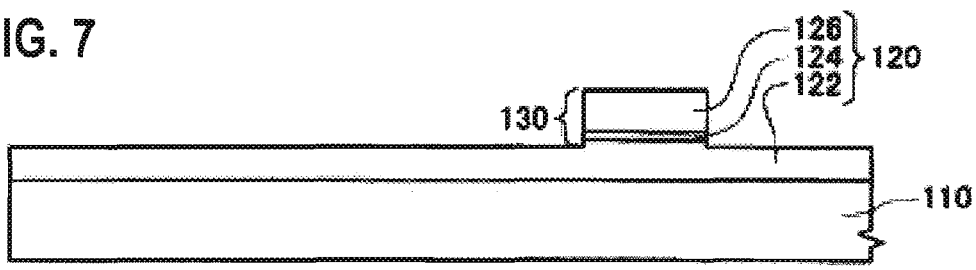
FIG. 7 is a view showing a step of the method for manufacturing an optical element in accordance with an embodiment of the invention.
Figure 8:
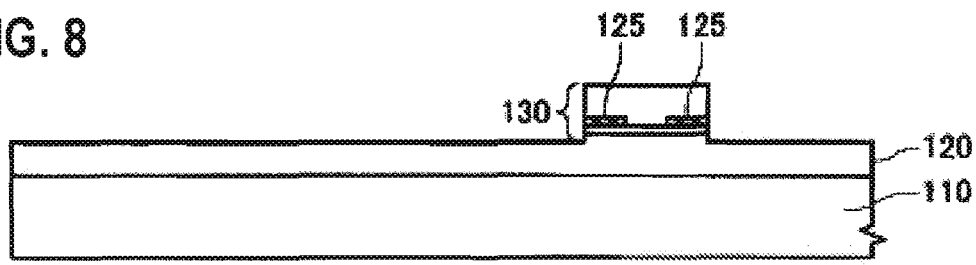
FIG. 8 is a view showing a step of the method for manufacturing an optical element in accordance with an embodiment of the invention.

FIGS. 6 through 8 are views showing a part of a method for manufacturing an optical element in accordance with an embodiment of the invention.

(B-1) First, as shown in FIGS. 6 through 8, an element section 120 including a columnar section 130 is formed on a substrate 110.

As shown in FIG. 6, on the surface of the semiconductor substrate 110 composed of n-type GaAs, a semiconductor multilayer film is formed by epitaxial growth while varying the composition. It is noted here that the semiconductor multilayer film is formed from, for example, a first mirror 122 of 40 pairs of alternately laminated n-type $Al_{0.9}Ga_{0.1}As$ layers and n-type $Al_{0.15}Ga_{0.85}As$ layers, an active layer 124 composed of GaAs well layers and $Al_{0.3}Ga_{0.7}As$ barrier layers in which the well layers include a quantum well structure composed of three layers, and a second mirror 126 of 25 pairs of alternately laminated p-type $Al_{0.9}Ga_{0.1}As$ layers and p-type $Al_{0.15}Ga_{0.85}As$ layers.

When growing the second mirror 126, at least one layer adjacent to the active layer 124 may be formed as an AlAs layer or an AlGaAs layer with an Al composition being 0.95 or higher. This layer is later oxidized and becomes a current constriction layer 125 (see FIG. 8). Also, the layer at the topmost surface of the second mirror 126 may preferably be formed to have a high carrier density, such that an ohmic contact can be readily made with an electrode 150.

The temperature at which the epitaxial growth is conducted is appropriately decided depending on the growth method, the kind of raw material, the type of the semiconductor substrate 110, and the kind, thickness and carrier density of the semiconductor multilayer film to be formed, and in general may preferably be 450° C.-800° C. Also, the time required for conducting the epitaxial growth is appropriately decided like the temperature. Also, a metal-organic vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, a resist layer (not shown) patterned in a predetermined shape is formed on the semiconductor multilayer film. By using the resist layer as a mask, the second mirror 126, the active layer 124 and a portion of the first mirror 122 are etched by, for example, a dry etching method, thereby forming a columnar section 130, as shown in FIG. 7.

Next, as shown in FIG. 8, by placing the substrate 110 on which the columnar section 130 is formed in a water vapor atmosphere at about 400° C., for example, a layer having a high Al composition (a layer with an Al composition being 0.95 or higher) provided in the above-described second mirror 126 is oxidized from its side surface, thereby forming the current constriction layer 125. The oxidation rate depends on the furnace temperature, the amount of water vapor that is supplied, and the Al composition and the film thickness of the layer to be oxidized. In the surface-emitting type semiconductor laser equipped with the current constricting layer 125 described above, when it is driven, an electric current flows only in a portion where the current constricting layer 125 is not formed (i.e., a portion that has not been oxidized). Accordingly, the current density can be controlled by controlling the forming region of the current constricting layer 125 in the process of forming the current constricting layer 125 by oxidation.

(B-2) Next, a resin layer 140 is formed (see FIG. 2).

The resin layer 140 may be formed through coating a precursor layer (not shown) over the entire surface of the element section 120, and then patterning the precursor layer. The precursor layer can be provided by, for example, a spin coat method, a dipping method, a spray coat method or the like. Alternatively, the precursor layer may be directly formed in a predetermined pattern by a droplet discharge method or the like. Then, the precursor layer may be heated at, for example, about 350° C., whereby the precursor layer is hardened and contracted, thereby forming the resin layer 140.

(B-3) Next, an electrode 150 is formed. For example, first, second and third conductive layers 160, 170 and 180 are laminated, whereby the electrode 150 composed of a plurality of layers is formed (see FIG. 2-FIG. 5).

The first, second and third conductive layers 160, 170 and 180 may be formed by, for example, a lift-off method.

Referring to the plan view in FIG. 3, first, a resist (not shown) is formed and patterned in a predetermined configuration. According to a lift-off method, conductive material in an area where the resist is provided is finally removed. Accordingly, the plane configuration of the resist after patterning defines an inverted configuration of a forming region of the first conductive layer 160. In other words, the resist is formed in one piece in an area covering the first aperture 164, the first opening section 162 that continues from the first aperture 164, and an area outside of the outer periphery of the first conductive layer 160 that continues from the first opening section 162.

Then, a film of conductive material is formed on the resist and its opening region. For example, a vapor deposition method, or a sputter method may be used as the film forming method. The conductive material may be formed into a single layer or a plurality of layers. In the case of a plurality of layers, the layers may be formed from mutually different materials. It is noted that, before the film of conductive material is formed, areas where the film is formed may be washed by a plasma treatment or the like, if necessary.

Then, by peeling the resist, portions of the conductive material on the resist are removed. By this, the conductive material remains only in open areas where the resist is not formed, and the remained portion of the conductive material becomes the first conductive layer 160. Accordingly, as described above, the first aperture 164 and the first opening section 162 are connected to each other, and an isolated pattern of the resist is not formed, such that removal of the resist becomes easier. Therefore the manufacturing process can be facilitated and the yield can be improved, as the resist can be excellently handled.

After the first conductive layer 160 has been formed, the second and third conductive layers 170 and 180 can be similarly formed by a lift-off method. Their details can be derived from the contents of the first conductive layer 160, and therefore are omitted.

Also, before the second conductive layer 170 is formed, an alloying treatment may be applied to the first conductive layer 160. The alloying treatment may be conducted by an anneal treatment at high temperature (for example, about 400° C.). By this, an ohmic contact with the first conductive layer 160 can be obtained. By conducting an alloying treatment before forming the second and third conductive layers 170 and 180, when the first conductive layer includes metal that would likely be oxidized, an oxide layer formed with the metal can be stopped at the topmost surface of the first conductive layer 160. In other words, by forming the second and third conductive layers 170 and 180 after an alloying treatment has been applied to the first conductive layer 160, oxidation of the topmost surface of the electrode 150 can be prevented. It is noted that the alloying treatment can be applied to the electrode 190 in a batch. The electrode 190 may be formed, for example, on the back surface of the substrate 110, and may be patterned in a predetermined configuration by, for example, a lift-off method.

(B-4) As a modified example, the first, second and third conductive layers 160, 170 and 180 can be formed by an etching method (a dry etching method or a wet etching method).

Referring to a plan view in FIG. 3, first, a film of conductive material is formed over the entire surface, and then a resist (not shown) is formed and patterned in a predetermined configuration on the conductive material film. The conductive material at open areas exposed through the resist is removed by etching. Accordingly, the plane configuration of the resist after patterning concurs with the forming region of the first conductive layer 160.

Then, portions of the conductive material provided in the open areas where the resist is not formed are removed by, for example, dry etching. By this, the conductive material remains only in a portion covered by the resist, and this portion becomes the first conductive layer 160. By this, as described above, a closed minute opening area does not need to be formed with resist, such that exposure and etching of the resist can be facilitated. In other words, the requirement on the resolution of etching is alleviated, and the manufacturing process can be facilitated.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. An optical element comprising:
    a columnar section rising in a vertical direction and having a substantially horizontal upper surface from which light is emitted or upon which light is incident; and
    an electrode composed of a plurality of layers including at least a first conductive layer and a second conductive layer laminated above the first conductive layer and electrically connected to the upper surface of the columnar section, wherein
    the first conductive layer having a first C-shaped section that surrounds a center section of the upper surface of the columnar section, the first C-shaped section having an first opening section that forms a first clear path in the horizontal direction between the center section and an exterior periphery of the first C-shaped section, and
    the second conductive layer having a second C-shaped section that surrounds the center section and overlaps the first C-shaped section, the second C-shaped section having a second opening section that forms a second clear path in the horizontal direction between the center section and an exterior periphery of the second C-shaped section.

2. An optical element according to claim 1, wherein at least one of the first and second conductive layers has a wiring section that extends outwardly from the columnar section, and the first and second opening sections open outwardly in directions different from a direction in which the wiring section extends.

3. An optical element according to claim 1, wherein the first and second opening sections open outwardly in mutually different directions, respectively, and the electrode is in a ring shape that encloses the center section of the upper surface of the columnar section.

4. An optical element according to claim 1, wherein the electrode further includes a third conductive layer laminated above the second conductive layer, wherein the third conductive layer has a third opening section that opens outwardly from the center section of the upper surface of the columnar section and surrounds the columnar section.

5. A method for manufacturing an optical element, the method comprising the steps of:
    forming, above a substrate, a columnar section rising in a vertical direction from the substrate and having a substantially horizontal an upper surface from which light is emitted or upon which light is incident; and
    forming an electrode electrically connected to the upper surface of the columnar section with a plurality of layers including at least a first conductive layer and a second conductive layer laminated above the first conductive layer, wherein
    the first conductive layer is formed to have a first C-shaped section that surrounds a center section of the upper surface of the columnar section, the first C-shaped section having an first opening section that forms a first clear path in the horizontal direction between the center section and an exterior periphery of the C-shaped section, and the second conductive layer is formed to have a second C-shaped section that surrounds the center section and overlaps the first C-shaped section, the second C-shaped section having a second opening section that forms a second clear path in the horizontal direction between the center section and an exterior periphery of the second C-shaped section.

6. A method for manufacturing an optical element according to claim 5, wherein the electrode is formed to include a third conductive layer laminated above the second conductive layer, and the third conductive layer is formed to have a third opening section that opens outwardly from the center section of the upper surface of the columnar section and to surround the center section.

7. A method for manufacturing an optical element according to claim 6, wherein the first, second and third conductive layers are formed by using one of a lift-off method and an etching method.

8. An optical element according to claim 1, wherein the second conductive layers has a wiring section that extends outwardly from the columnar section, and the first and second opening sections open outwardly in directions different from a direction in which the wiring section extends.

9. An optical element according to claim 8, wherein the second conductive layers has a pad section.

10. An optical element according to claim 4, wherein at the third conductive layers has a wiring section that extends outwardly from the columnar section, and the first, second and third opening sections open outwardly in directions different from a direction in which the wiring section extends.

11. An optical element according to claim 10, wherein the third conductive layers has a pad section.

12. An optical element comprising:

a columnar section rising in a vertical direction having a substantially horizontal upper surface from which light is emitted or upon which light is incident; and an electrode composed of a plurality of layers including at least a first conductive layer and a second conductive layer laminated above the first conductive layer and electrically connected to the upper surface of the columnar section, wherein the second conductive layer has a C-shaped section, that surrounds a center section of the columnar section, and overlaps the first conductive layer above the columnar section, the C-shaped section having only one opening section that forms a clear path in the horizontal direction between the center section and an exterior periphery of the C-shaped section.

\* \* \* \* \*